United States Patent

Suzuki et al.

[11] Patent Number: 5,923,087
[45] Date of Patent: Jul. 13, 1999

[54] SEMICONDUCTOR DEVICE COMPRISING BONDING PAD OF BARRIER METAL, SILICIDE AND ALUMINUM

[75] Inventors: Hiromi Suzuki; Toshinori Sato, both of Tochigi-ken, Japan

[73] Assignee: Nippon Precision Circuits Inc., Tokyo, Japan

[21] Appl. No.: 08/782,394

[22] Filed: Jan. 13, 1997

[30] Foreign Application Priority Data

Jan. 19, 1996 [JP] Japan .................................. 8-007696

[51] Int. Cl.⁶ .......................... H01L 23/48; H01L 21/441
[52] U.S. Cl. .......................... 257/754; 257/751; 257/753; 257/764; 438/649
[58] Field of Search ............................ 438/649; 257/754, 257/751, 753, 764

[56] References Cited

U.S. PATENT DOCUMENTS

| 4,332,839 | 6/1982 | Levinstein et al. ............... 438/649 |
| 4,507,852 | 4/1985 | Karulker ........................... 438/649 |
| 4,916,397 | 4/1990 | Masuda et al. . | |
| 4,962,414 | 10/1990 | Liou et al. . | |
| 5,552,341 | 9/1996 | Lee . | |
| 5,554,564 | 9/1996 | Nishioka et al. . | |
| 5,554,866 | 9/1996 | Nishioka et al. . | |
| 5,703,403 | 12/1997 | Sobue et al. . | |
| 5,811,851 | 8/1998 | Nishioka et al. . | |

FOREIGN PATENT DOCUMENTS

| 0-431-721 | 6/1991 | European Pat. Off. . |
| 4-56359 | 2/1992 | Japan . |
| 5-206134 | 8/1993 | Japan . |

Primary Examiner—Olik Chaudhuri
Assistant Examiner—Alonzo Chambliss
Attorney, Agent, or Firm—Jordan and Hamburg LLP

[57] ABSTRACT

To provide a semiconductor device and a method of making a semiconductor device capable of preventing exfoliation at a pad electrode portion, a barrier metal layer 14, a silicon layer 15 and an aluminum layer 16 are formed on a side of a main face of a silicon substrate 11 (step A), the barrier metal layer 14, the silicon layer 15 and the aluminum layer 16 are patterned into a shape of a pad electrode (step B) and a silicide layer 17 is formed by an annealing treatment successive to the patterning step (step C).

8 Claims, 1 Drawing Sheet

SEMICONDUCTOR DEVICE COMPRISING BONDING PAD OF BARRIER METAL, SILICIDE AND ALUMINUM

BACKGROUND OF THE INVENTION

1. Field of the Invention

The present invention relates to a semiconductor device and a method of making a semiconductor device, particularly to a semiconductor device and a method of making a semiconductor device in respect of a pad electrode for wire bonding.

2. Description of Related Art

A conventional pad electrode is made by forming an aluminum layer (generally, a layer comprising a material in which a pertinent amount of silicon is included in aluminum) directly on a barrier metal layer.

However, when the conventional structure is used exfoliation is liable to occur between the barrier metal layer and the aluminum layer due to damage from heat or ultrasonic wave used in connecting a wire to the pad electrode in a wire bonding step.

SUMMARY OF THE INVENTION

It is an object of the present invention to provide a semiconductor device and a method of making a semiconductor device capable of preventing exfoliation at a pad electrode portion.

According to the present invention, the adhesion between a barrier metal layer and an aluminum layer is improved by providing a silicide layer between the barrier metal layer and the aluminum layer.

According to the present invention, there is provided a semiconductor device in which a pad electrode is constituted by a barrier metal layer, a silicide layer on the barrier metal layer and an aluminum layer on the silicide layer.

According to the present invention, there is provided a method of making a semiconductor device comprising the steps of successively forming a barrier metal layer, a silicon layer and an aluminum layer, patterning the barrier metal layer, the silicon layer and the aluminum layer into a shape of a pad electrode and annealing the barrier metal layer, the silicon layer and the aluminum layer thereby combining a portion of the barrier metal layer and the silicon layer into a silicide layer.

DETAILED DESCRIPTION OF THE PREFERRED EMBODIMENTS

Figure 1A:
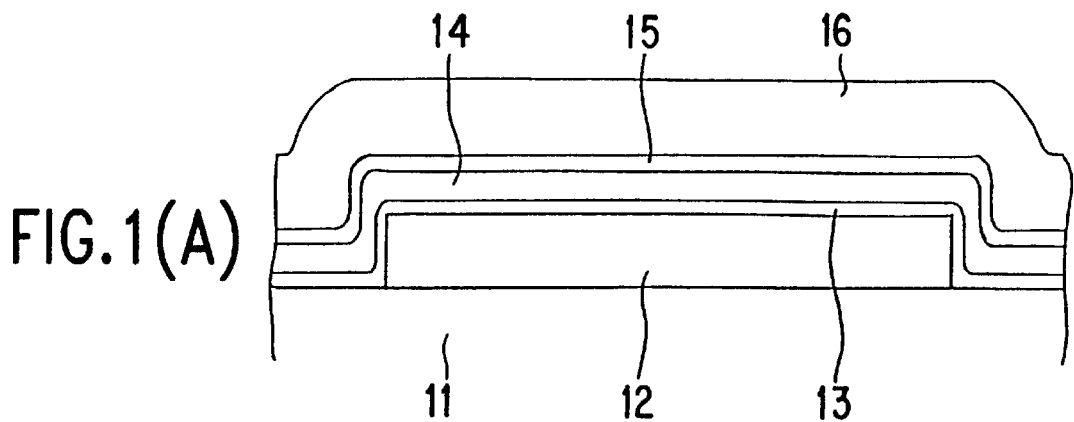
FIGS. 1(A), 1(B) and 1(C) are explanatory views showing an embodiment of the present invention.
Figure 1B:
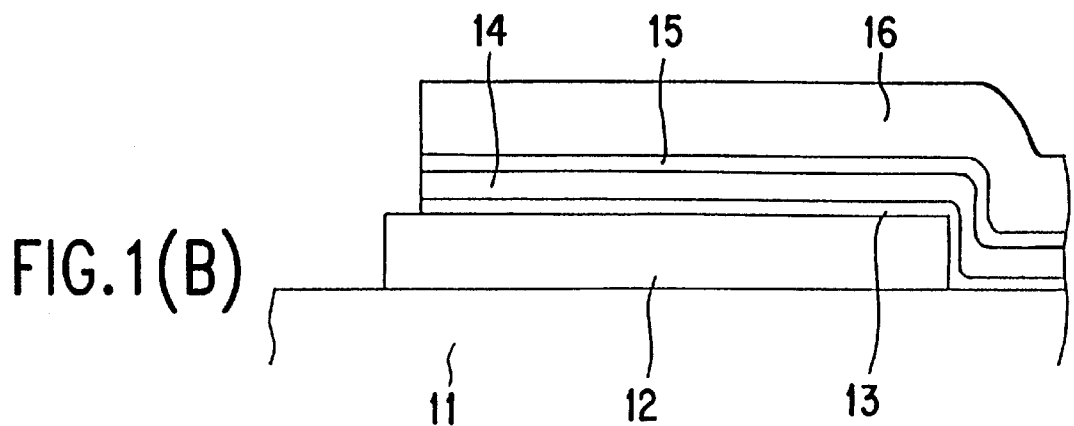
Figure 1C:
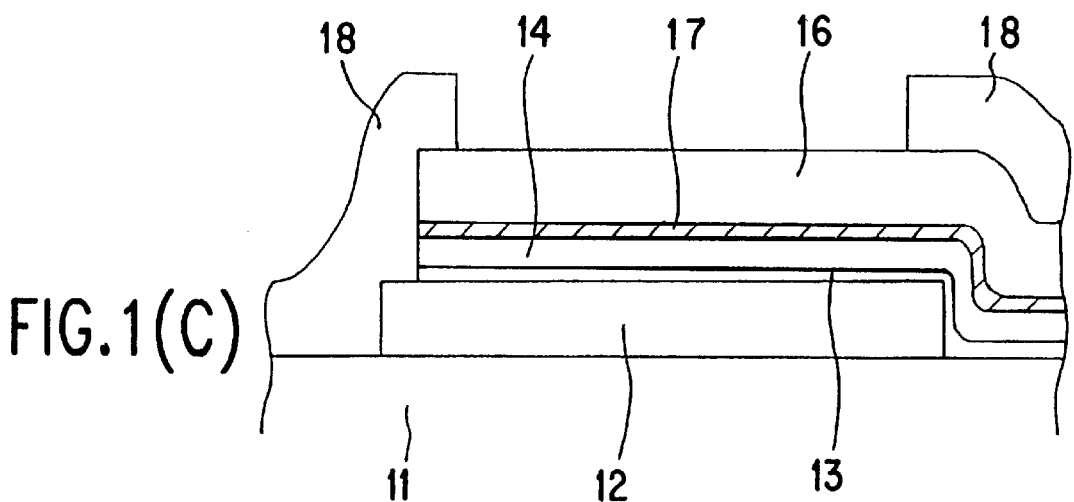

An explanation will be given of embodiments of the present invention in reference to the drawings as follows. FIGS. 1(A), 1(B) and 1(C) are explanatory views showing a pad electrode and its surroundings in an IC (Integrated Circuit) in an order of production steps. Firstly, titanium (Ti) layer 13 (layer thickness; about 20 nm) is formed on a silicon substrate 11 and an inter-layer insulating layer 12 on the silicon substrate 11 by a sputtering process. A barrier metal layer 14 (layer thickness; about 50 through 80 nm) using titanium nitride (TiN) is formed on the titanium layer 13 by a reactive sputtering process. A silicon (Si) layer 15 (layer thickness; about 10 through 20 nm) is formed on the barrier metal layer 14 by a sputtering process. An aluminum (Al) layer 16 (layer thickness; about 800 nm, here, a layer comprising a material where a pertinent amount of silicon is included in aluminum) is formed on the silicon layer 15 by a sputtering process. The above steps for forming the respective layers are carried out continuously without breaking a vacuum enclosure (step A). Next, the titanium layer 13, the barrier metal layer 14, the silicon layer 15 and the aluminum layer 16 are patterned by a normal photolithography step and an etching step. Wirings at a circuit portion are simultaneously formed in the step (step B). After finishing the patterning step of the circuit wiring or the like in this way, an annealing treatment is carried out at 400 through 500° C. for about 30 minutes through 1 hour in a nitrogen atmosphere. By this annealing treatment the silicon layer 15 reacts with a portion of the barrier metal layer 14 whereby a silicide layer 17 is formed. Further, the adhesion among the respective contiguous layers is improved by the annealing treatment. Finally, after forming a protective insulating layer 18, an opening portion is formed in the protective insulating layer 18 in correspondence with a pad electrode (step C).

The silicide layer 17 is formed between the barrier metal layer 14 and the aluminum layer 16 by the annealing treatment by which the adhesion between both layers is improved and the adhesion among the respective layers is promoted by the annealing treatment. Accordingly, exfoliation is at the pad electrode portion due to damage derived from heat or ultrasonic wave or the like used for connecting a wire to the pad electrode in wire bonding step is prevented. Further, when the annealing step (step C) is carried out prior to the patterning step (step B), the etching may become difficult in the patterning step. However, such a problem is avoided in the embodiment since the annealing step is carried out after the patterning step.

Incidentally, in respect of the aluminum layer 16, a layer using only aluminum may be used instead of the layer using a material whose major component is aluminum as in the above-described embodiment. Further, in respect of the barrier metal layer 14, generally a metal having a high melting point or a metal compound having a high melting point such as titanium nitride described above, may be used.

According to the semiconductor device in accordance with the present invention, a second electrode layer using a silicide is formed between a first electrode layer using a barrier metal and a third electrode layer using a material whose major component is aluminum and accordingly, the adhesion between the first electrode layer and the third electrode layer is improved. Accordingly, exfoliation caused at the pad electrode portion by damage from heat or ultrasonic wave or the like used in connecting a wire to the pad electrode in wire bonding step is prevented.

According to a method of making a semiconductor device in accordance with the present invention, the silicide layer is formed between the first electrode layer using a barrier metal and the third electrode layer using a material whose major component is aluminum by the annealing treatment and accordingly, the adhesion between the first electrode layer and the third electrode layer is improved. Also, the adhesion among the respective layers is promoted by the annealing treatment and therefore, exfoliation is caused at the pad electrode portion by damage from heat or ultrasonic wave or the like used in connecting a wire to the pad electrode in wire bonding is prevented.

What is claimed is:

1. A semiconductor device with a substrate having a bonding pad electrode disposed thereon for a wire to be bonded thereto, said bonding pad electrode comprising:
   a first electrode layer formed of a barrier metal disposed over said substrate;
   a second electrode layer formed of a silicide adhered on the first electrode layer such that said first electrode layer is interposed between said second electrode layer and said substrate;
   a third electrode layer formed of a conductive material including aluminum and adhered on the second electrode layer such that said second electrode layer is interposed between said first electrode layer and said third electrode layer; and
   said third layer having an exposed upper surface for permitting the wire to be bonded thereto.

2. The semiconductor device of claim 1 wherein said barrier metal of said first electrode layer is titanium nitride.

3. The semiconductor device of claim 2 further comprising a titanium layer interposed between and adhered to said first electrode layer and said substrate.

4. The semiconductor device of claim 3 wherein said second electrode layer of said silicide is formed by disposing a layer of silicon between said first electrode layer and said third electrode layer and annealing.

5. The semiconductor device of claim 1 wherein said second electrode layer of said silicide is formed by disposing a layer of silicon between said first electrode layer and said third electrode layer and annealing.

6. The semiconductor device of claim 5 further comprising a titanium layer interposed between and adhered to said first electrode layer and said substrate.

7. The semiconductor device of claim 5 wherein said second electrode layer of said silicide is formed by disposing a layer of silicon between said first electrode layer and said third electrode layer and annealing.

8. The semiconductor device of claim 1 further comprising a titanium layer interposed between and adhered to said first electrode layer and said substrate.

* * * * *